United States Patent
Nam et al.

(10) Patent No.: US 10,018,914 B2
(45) Date of Patent: Jul. 10, 2018

(54) HARDMASK COMPOSITION AND METHOD OF FORMING PATTERNS USING THE HARDMASK COMPOSITION

(71) Applicant: SAMSUNG SDI CO., LTD., Yongin-si, Gyeonggi-do (KR)

(72) Inventors: Youn-Hee Nam, Suwon-si (KR); Mi-Young Kim, Suwon-si (KR); You-Jung Park, Suwon-si (KR); Yun-Jun Kim, Suwon-si (KR); Hea-Jung Kim, Suwon-si (KR); Joon-Young Moon, Suwon-si (KR); Hyun-Ji Song, Suwon-si (KR); Chung-Heon Lee, Suwon-si (KR); Yoo-Jeong Choi, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 14/685,180

(22) Filed: Apr. 13, 2015

(65) Prior Publication Data
US 2015/0332931 A1 Nov. 19, 2015

(30) Foreign Application Priority Data
May 16, 2014 (KR) ........................ 10-2014-0059252

(51) Int. Cl.
| | |
|---|---|
| *G03F 7/09* | (2006.01) |
| *H01L 21/308* | (2006.01) |
| *H01L 21/311* | (2006.01) |
| *H01L 21/321* | (2006.01) |
| *C08L 65/00* | (2006.01) |

(Continued)

(52) U.S. Cl.
CPC .............. *G03F 7/094* (2013.01); *C08L 65/00* (2013.01); *G03F 7/0752* (2013.01); *G03F 7/091* (2013.01); *H01L 21/3081* (2013.01); *H01L 21/3086* (2013.01); *H01L 21/31144* (2013.01); *H01L 21/32139* (2013.01)

(58) Field of Classification Search
None
See application file for complete search history.

(56) References Cited

U.S. PATENT DOCUMENTS

| | | | | |
|---|---|---|---|---|
| 3,690,982 A | * | 9/1972 | Numata et al. | ........ D01D 5/253 156/148 |
| 4,642,282 A | * | 2/1987 | Stahlhofen | ............. C08G 61/00 430/165 |

(Continued)

FOREIGN PATENT DOCUMENTS

| | | | |
|---|---|---|---|
| JP | 54-116097 | * | 9/1979 |
| JP | 10-265554 | * | 10/1998 |

(Continued)

OTHER PUBLICATIONS

Machine translation of JP 2005-114921 (2005).*
Search Report dated Dec. 7, 2015 in corresponding Taiwanese Patent Application No. 104112155.

*Primary Examiner* — Martin J Angebranndt
(74) *Attorney, Agent, or Firm* — Lee & Morse, P.C.

(57) ABSTRACT

A hardmask composition includes a polymer including a moiety represented by the following Chemical Formula 1 and a solvent.

\*-A-B—\*                     [Chemical Formula 1]

In the Chemical Formula 1, A and B are the same as defined in the detailed description.

5 Claims, 1 Drawing Sheet

(51) Int. Cl.
  *H01L 21/3213* (2006.01)
  *G03F 7/075* (2006.01)

(56) References Cited

U.S. PATENT DOCUMENTS

| | | | | |
|---|---|---|---|---|
| 4,717,640 A * | 1/1988 | Stahlhofen | ............ | G03F 7/0233 430/165 |
| 6,103,443 A * | 8/2000 | Wanat | ................... | G03F 7/0233 430/191 |
| 7,303,855 B2 * | 12/2007 | Hatakeyama | ........... | G03F 7/091 430/270.1 |
| 7,829,638 B2 * | 11/2010 | Uh | ......................... | G03F 7/091 430/271.1 |
| 8,153,349 B2 * | 4/2012 | Cheon | .................... | G03F 7/091 430/311 |
| 8,420,289 B2 * | 4/2013 | Kim | ........................ | G03F 7/091 430/270.1 |
| 8,741,540 B2 * | 6/2014 | Kim | ........................ | G03F 7/094 430/270.1 |
| 2003/0069357 A1* | 4/2003 | Kaji | ........................ | C08L 61/06 525/107 |
| 2006/0234158 A1* | 10/2006 | Hatakeyama | ........... | G03F 7/094 430/270.1 |
| 2008/0305441 A1* | 12/2008 | Yoon | ........................ | G03F 7/091 430/323 |
| 2010/0021830 A1* | 1/2010 | Kim | ........................ | G03F 7/091 430/5 |
| 2012/0251943 A1* | 10/2012 | Rahman | .................. | G03F 7/091 430/270.1 |
| 2012/0251956 A1* | 10/2012 | Rahman | ................. | C08G 61/02 430/311 |
| 2013/0171569 A1* | 7/2013 | Tachibana | ............... | G03F 7/004 430/287.1 |
| 2014/0349222 A1* | 11/2014 | Shibui | ..................... | G03F 7/038 430/18 |
| 2014/0370444 A1* | 12/2014 | Rahman | ................ | G03F 7/0757 430/311 |
| 2016/0126088 A1* | 5/2016 | Kim | .................. | H01L 21/02118 257/618 |
| 2016/0304700 A1* | 10/2016 | Kang | ....................... | C08K 5/13 |
| 2017/0176861 A1* | 6/2017 | Nam | ....................... | C08G 61/10 |

FOREIGN PATENT DOCUMENTS

| | | | |
|---|---|---|---|
| JP | 2005-114921 | * | 4/2005 |
| JP | 2007-017867 A | | 1/2007 |
| JP | 2008-065081 A | | 3/2008 |
| KR | 10-2006-0094175 | | 8/2006 |
| KR | 10-2006-0132069 A | | 12/2006 |
| KR | 10-0671120 B1 | | 1/2007 |
| KR | 10-0866015 B1 | | 10/2008 |
| KR | 10-2008-0107210 A | | 12/2008 |
| KR | 10-0874655 B1 | | 12/2008 |
| KR | 10-0938445 B1 | | 1/2010 |
| KR | 10-2010-0044111 A | | 4/2010 |
| KR | 2010-0080147 | * | 7/2010 |
| KR | 10-2011-0086812 A | | 8/2011 |
| KR | 10-2012-0077466 | | 7/2012 |
| TW | 200710578 A | | 3/2007 |
| TW | 200712781 A | | 4/2007 |
| TW | 201319749 A | | 5/2013 |
| TW | 201405250 A | | 2/2014 |

* cited by examiner

[Calculation Equation 1]
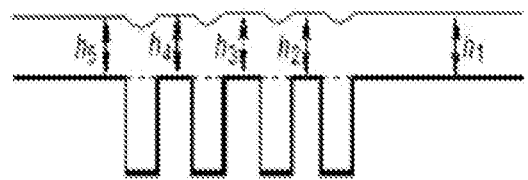
Step Difference (Sum/nm) = (h1-h2) + (h1-h3) + (h1-h4) + (h1-h5)

HARDMASK COMPOSITION AND METHOD OF FORMING PATTERNS USING THE HARDMASK COMPOSITION

CROSS-REFERENCE TO RELATED APPLICATION

Korean Patent Application No. 10-2014-0059252, filed on May 16, 2014, in the Korean Intellectual Property Office, and entitled: "Hardmask Composition and Method of Forming Patterns Using the Hardmask Composition," is incorporated by reference herein in its entirety.

BACKGROUND

1. Field

Embodiments relate to a hardmask composition and a method of forming patterns using the hardmask composition.

2. Description of the Related Art

Recently, the semiconductor industry has developed to an ultra-fine technique having a pattern of several to several tens nanometer size. Such ultrafine technique is facilitated by effective lithographic techniques. A general lithographic technique includes providing a material layer on a semiconductor substrate; coating a photoresist layer thereon; exposing and developing the same to provide a photoresist pattern; and etching the material layer using the photoresist pattern as a mask.

SUMMARY

Embodiments are directed to a hardmask composition that includes a polymer including a moiety represented by the following Chemical Formula 1 and a solvent.

*—A-B—*  [Chemical Formula 1]

In the Chemical Formula 1,

A may be a group including a substituted or unsubstituted aromatic ring, and

B may be one of groups listed in the following Group 1.

[Group 1]

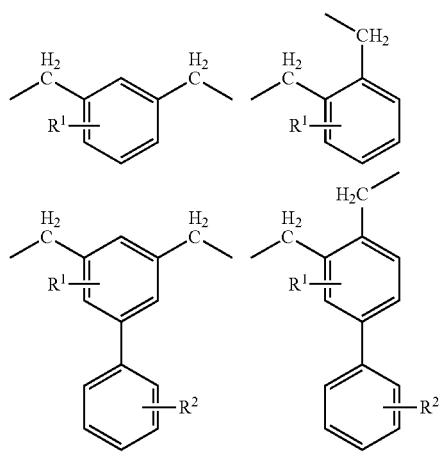

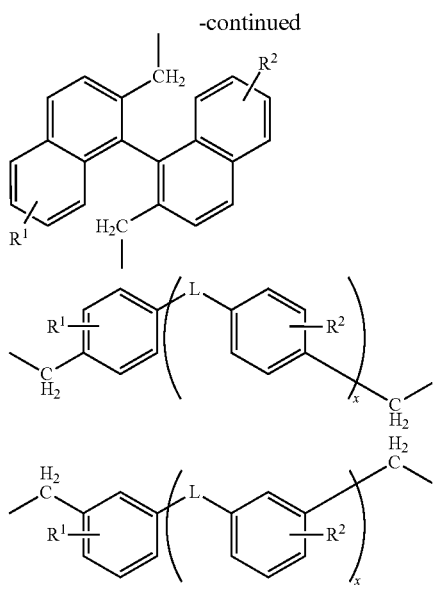

In the Group 1, $R^1$ and $R^2$ may independently be hydrogen (—H), a hydroxy group (—OH), a methoxy group (—OCH$_3$), an ethoxy group (—OC$_2$H$_5$), a halogen (—F, —Cl, —Br, —I), a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, L may be —O—, —S—, —SO$_2$—, or carbonyl, and x may be an integer of $1 \leq x \leq 30$.

The A may be a substituted or unsubstituted C6 to C50 arylene group.

The A may be one of groups listed in the following Group 2:

[Group 2]

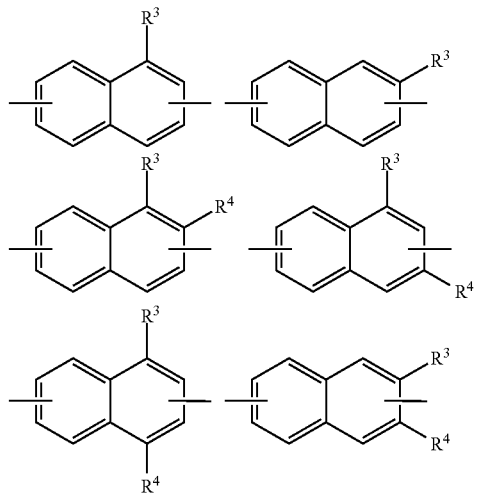

-continued

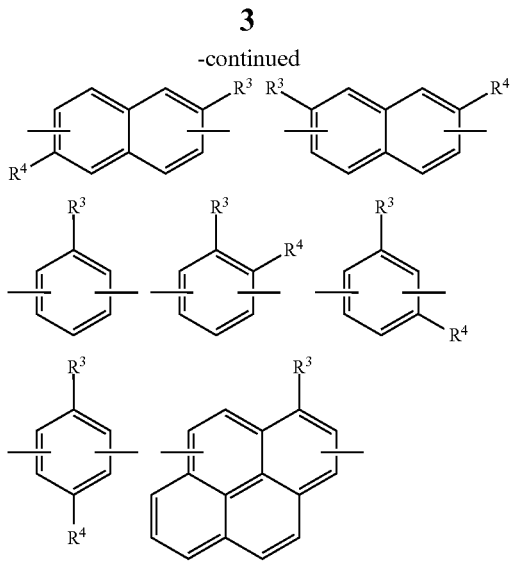
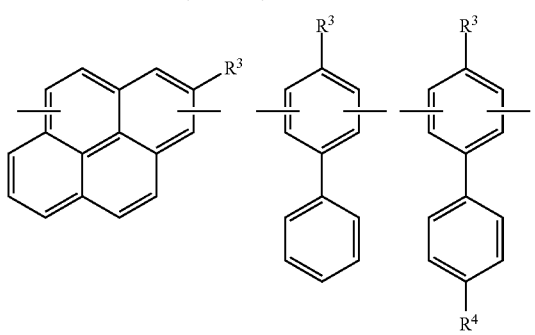
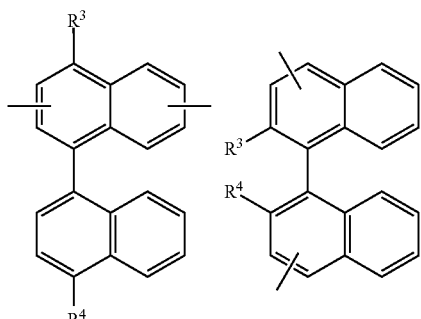
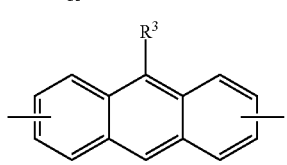
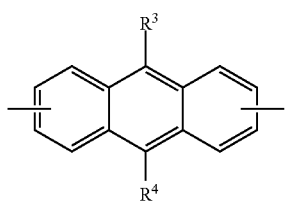
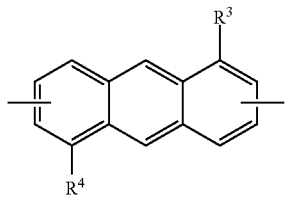

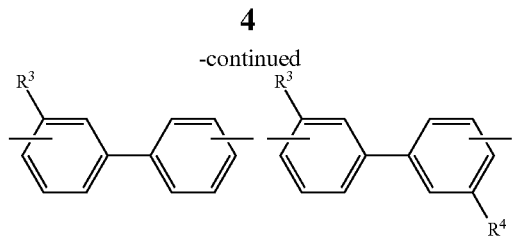
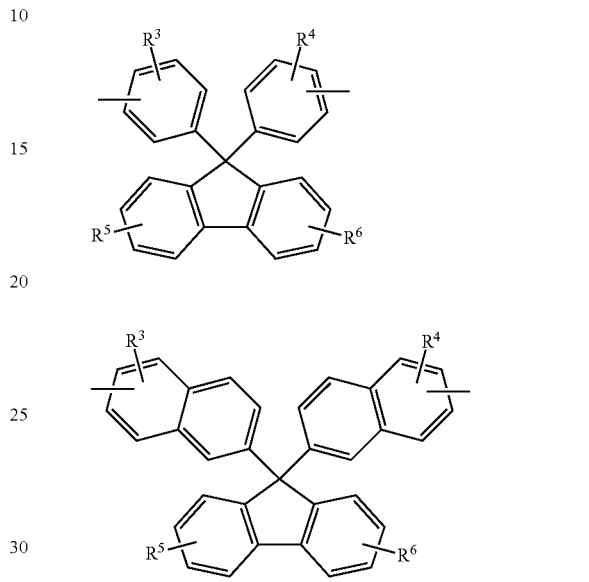

In the Group 2, $R^3$ to $R^6$ may independently be hydrogen (—H), a hydroxy group (—OH), a methoxy group (—OCH$_3$), an ethoxy group (—OC$_2$H$_5$), a halogen (—F, —Cl, —Br, —I), a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

The polymer may be represented by the following Chemical Formula 2.

[Chemical Formula 2]

$$*\text{---}[A^1\text{---}B^1]_l\text{---}[A^2\text{---}B^2]_m\text{---}[A^3\text{---}B^3]_n\text{---}*$$

In the Chemical Formula 2, $A^1$, $A^2$ and $A^3$ may independently be groups including a substituted or unsubstituted aromatic ring, $B^1$, $B^2$ and $B^3$ may independently be one of groups listed in the following Group 1, and l, m and n may be integers of $0 \leq l \leq 200$, $0 \leq m \leq 200$ and $0 \leq n \leq 200$, and the sum of the l, m and n may be at least 1.

The $A^3$ may be a group represented by the following Chemical Formula 3.

[Chemical Formula 3]

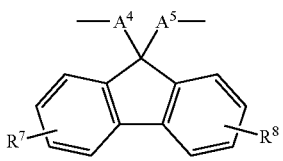

In the Chemical Formula 3, $A^4$ and $A^5$ may independently be one of the groups listed in the Group 2, and $R^7$ and $R^8$ may independently be hydrogen (—H), a hydroxy group (—OH), a methoxy group (—OCH$_3$), an ethoxy group (—OC$_2$H$_5$), a halogen (—F, —Cl, —Br, —I), a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

In the Chemical Formula 2, the $A^1$, $A^2$ and $A^3$ may be one of the groups listed in the Group 2.

The polymer may have a weight average molecular weight of about 1,000 to about 200,000.

The polymer may be included in an amount of about 0.1 wt % to about 30 wt % based on the total amount of the composition.

According to another embodiment, a method of forming patterns may include providing a material layer on a substrate, applying the hardmask composition on the material layer, heat-treating the hardmask composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The hardmask composition may be applied using a spin-on coating method.

The process of forming the hardmask layer may include heat-treating at about 100° C. to about 500° C.

The method may further include forming a bottom anti-reflective coating (BARC) before forming the photoresist layer.

The silicon-containing thin layer may include silicon oxynitride (SiON).

BRIEF DESCRIPTION OF THE DRAWING

Features will become apparent to those of skill in the art by describing in detail exemplary embodiments with reference to the attached drawing in which:

FIG. 1 illustrates Calculation Equation 1 for evaluating planarization characteristics of hardmask layers according to Examples and Comparative Examples.

DETAILED DESCRIPTION

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, when a definition is not otherwise provided, the term 'substituted' may refer to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of a hydrogen atom of a compound.

As used herein, when a definition is not otherwise provided, the term 'hetero' refers to one including 1 to 3 heteroatoms selected from B, N, O, S, and P.

Hereinafter, a hardmask composition according to an example embodiment is described.

A hardmask composition according to an example embodiment includes a polymer including a moiety represented by the following Chemical Formula 1 and a solvent.

 [Chemical Formula 1]

According to the present example embodiment, in the Chemical Formula 1,

A is a group including a substituted or unsubstituted aromatic ring, and

B is one of groups listed in the following Group 1.

[Group 1]

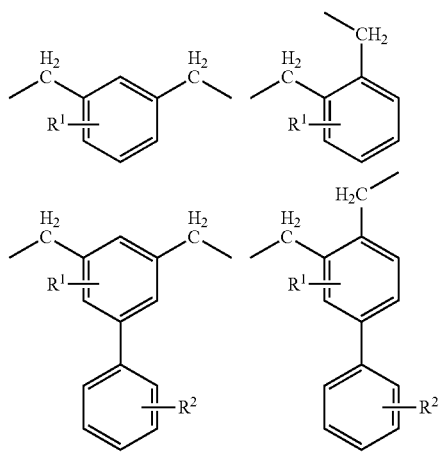

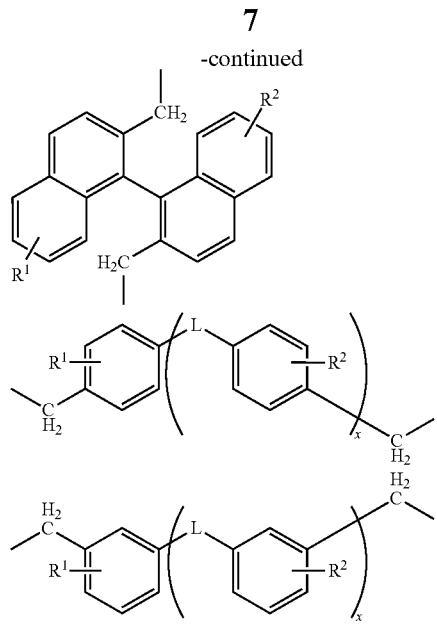

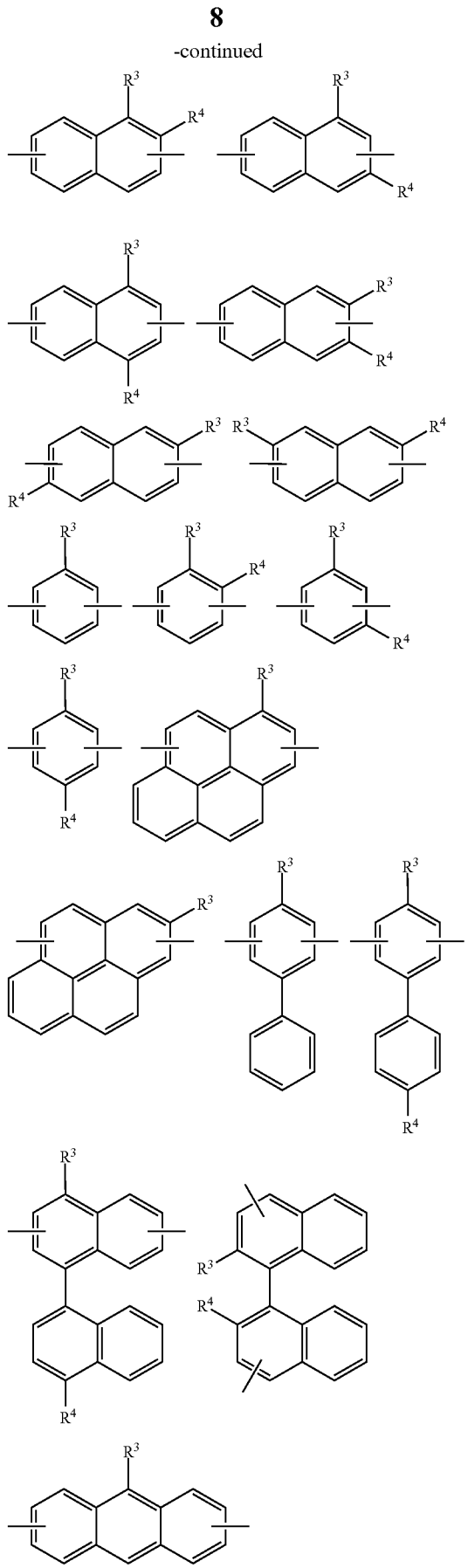

In the Group 1,

R[1] and R[2] are independently hydrogen (—H), a hydroxy group (—OH), methoxy (—OCH$_3$), ethoxy (—OC$_2$H$_5$), a halogen (—F, —Cl, —Br, —I), a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, L is —O—, —S—, —SO$_2$—, or carbonyl

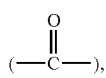

and x is an integer of 1≤x≤30.

The polymer includes an aromatic ring moiety represented by A and a linker moiety represented by B in repeating units.

The aromatic ring moiety, A, may help impart rigid characteristics to the polymer. For example, the aromatic ring moiety A may be a substituted or unsubstituted C6 to C50 arylene group, or a C6 to C40 arylene group. For example, the aromatic ring moiety A may be one of groups listed in the following Group 2:

[Group 2]

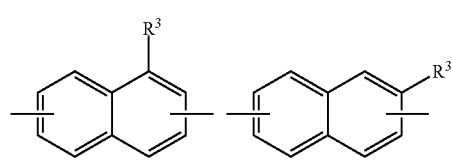

-continued

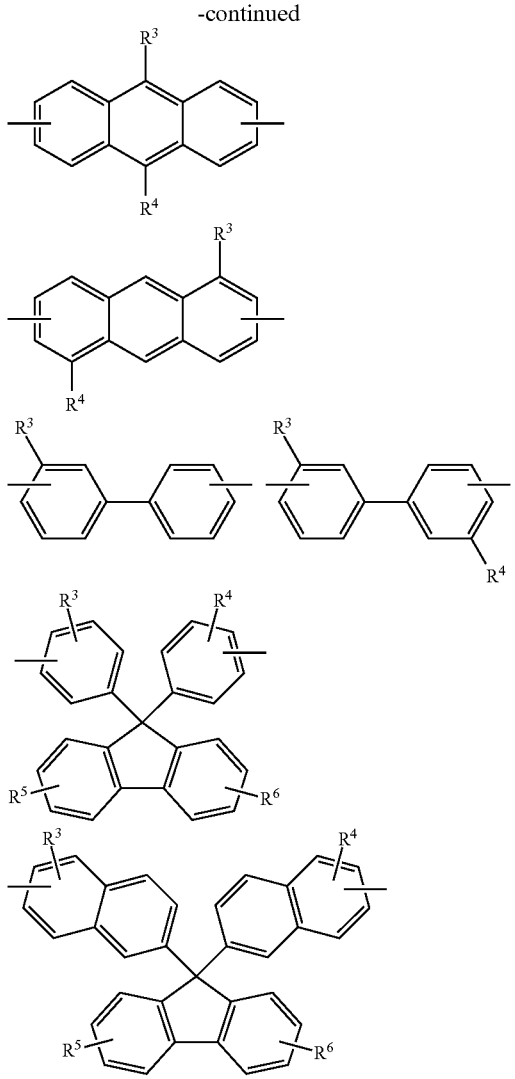

In the Group 2, $R^3$ to $R^6$ are independently hydrogen (—H), a hydroxy group (—OH), methoxy (—OCH$_3$), ethoxy (—OC$_2$H$_5$), a halogen (—F, —Cl, —Br, —I), a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

The repeating unit of the polymer includes a linker moiety B. The linker moiety B may be selected from the Group 1, and the linking groups listed in the Group 1 may be groups with an ortho or meta structure, or a group including a linker selected from —O—, —S—, —SO$_2$— and carbonyl

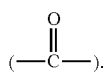

According to the present example embodiment, the linking group may help increase flexibility of the polymer. Such a flexible structure may not only improve solubility by increasing a free volume of the polymer, but may also improve gap-fill performance and planarization by decreasing a glass transition temperature (Tg) and thus, increasing a reflow during the bake process.

The polymer may include a plurality of the moiety represented by Chemical Formula 1, and a plurality of the moiety may have the same structure or a different structure to one another.

In an example embodiment, the polymer may be represented by the following Chemical Formula 2.

[Chemical Formula 2]

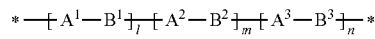

According to the present example embodiment, in the Chemical Formula 2, $A^1$, $A^2$ and $A^3$ are independently groups including a substituted or unsubstituted aromatic ring, $B^1$, $B^2$ and $B^3$ are independently one of groups listed in the following Group 1, l, m and n are integers of $0 \leq l \leq 200$, $0 \leq m \leq 200$ and $0 \leq n \leq 200$, and the sum of the l, m and n is at least 1.

In the Chemical Formula 2, $A^1$, $A^2$ and $A^3$ may be independently, for example, a substituted or unsubstituted C6 to C50 arylene group, or a substituted or unsubstituted C6 to C40 arylene group.

In the Chemical Formula 2, $A^3$ may be, for example, represented by the following Chemical Formula 3.

[Chemical Formula 3]

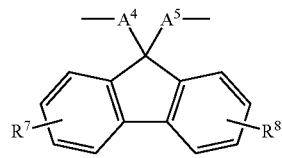

In the Chemical Formula 3, $A^4$ and $A^5$ are independently one of the groups listed in the Group 2, $R^7$ and $R^8$ are independently hydrogen (—H), a hydroxy group (—OH), methoxy (—OCH$_3$), ethoxy (—OC$_2$H$_5$), a halogen (—F, —Cl, —Br, —I), a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

In the Chemical Formula 2, $A^1$, $A^2$ and $A^3$ may be one of the groups listed in the Group 2.

The polymer may have a weight average molecular weight of about 1,000 to about 200,000. When the polymer has a weight average molecular weight within the range, the carbon content and solubility of the hardmask composition including the polymer may be adjusted and optimized.

The solvent may be a suitable solvent dissolving or dispersing the polymer, and may be, for example, at least one selected from propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyl lactate, gamma-butyrolactone, methylpyrrolidone and acetylacetone.

The polymer may be included in an amount of about 0.1 to about 30 wt % based on the total amount of the organic layer composition. When the polymer is included in the above range, a thickness, surface roughness and planarization of the organic layer may be controlled.

The hardmask composition may further include a surfactant.

The surfactant may include, for example, alkylbenzene sulfonate salt, alkyl pyridinium salt, polyethylene glycol, a quaternary ammonium salt, etc.

The surfactant may be included in an amount of about 0.001 to about 3 parts by weight based on 100 parts by weight of the hardmask composition. When the surfactant is included within the range, solubility may be improved without changing optical properties of the hardmask composition.

Hereafter, a method for forming patterns by using hardmask composition is described.

A method of forming patterns according to an example embodiment includes providing a material layer on a substrate, applying the hardmask composition including the compound according to an embodiment and the solvent on the material layer, heat-treating the hardmask composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The substrate may be, for example, a silicon wafer, a glass substrate, or a polymer substrate.

The material layer is a material to be finally patterned, for example, a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The hardmask composition is the same as described above, and may be applied by spin-on coating in a form of a solution. Herein, a thickness of the hardmask composition may be, for example, about 50 Å to about 10,000 Å.

The heat-treating the hardmask composition may be performed, for example, at about 100 to about 500° C. for about 10 seconds to 1 hour.

The silicon-containing thin layer may be formed of, for example, silicon nitride or silicon oxide.

The method may further include forming a bottom anti-reflective coating (BARC) on the silicon-containing thin layer before forming the photoresist layer.

Exposure of the photoresist layer may be performed using, for example, ArF, KrF, or EUV light. After exposure, heat treatment may be performed at, for example, about 100° C. to about 500° C.

The etching process of the exposed part of the material layer may be performed through a dry etching process using an etching gas and the etching gas may be, for example, $CHF_3$, $CF_4$, $Cl_2$, $BCl_3$, or a mixed gas thereof.

The etched material layer may be formed in a plurality of patterns, and the plurality of patterns may be or include a metal pattern, a semiconductor pattern, an insulation pattern, and the like, for example, diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLES

Synthesis Example 1

21.83 g of hydroxypyrene, 25.81 g of 4,4'-bismethylmethoxy-diphenylether, 1.23 g of diethylsulfate and 32.58 g of propylene glycol monomethyl ether acetate (PGMEA) were put in a flask and then agitated at 100° C. for 2 to 6 hours to perform a polymerization reaction. The reaction was finished when the polymer had a weight average molecular weight of 2,000 to 3,500. When the polymerization reaction was terminated, the reactant was slowly cooled down to room temperature and 40 g of distilled water and 400 g of methanol were added thereto, and the mixture was strongly agitated and allowed to stand. After removing a supernatant therefrom, a precipitate produced therein was dissolved in 80 g of cyclohexanone, and the solution was strongly agitated with 320 g of methanol and allowed to stand (a first process). Then, after removing a supernatant produced therefrom, a precipitate therein was dissolved in 80 g of cyclohexanone again (a second process). The first and second processes are regarded as one purification process, and this purification process repeated three times in total. The purified polymer was dissolved in 80 g of cyclohexanone, and methanol and distilled water remaining in the solution were removed under a reduced pressure, obtaining a compound represented by the following Chemical Formula 4.

[Chemical Formula 4]

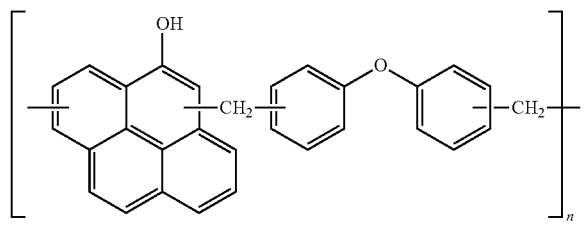

Synthesis Example 2

22.53 g of 9,9-bis(6-hydroxy-2-naphthyl)fluorene, 12.91 g of 4,4'-bismethylmethoxy-diphenylether, 0.77 g of diethylsulfate and 59.07 g of propylene glycol monomethyl ether acetate (PGMEA) were put in a flask and then agitated at 100° C. for 5 to 12 hours to perform a polymerization reaction. The reaction was finished when the polymer had a weight average molecular weight of 2,000 to 3,500. When the polymerization reaction was terminated, the reactant was cooled down to room temperature and then 40 g of distilled water and 400 g of methanol were added thereto, and the mixture was strongly agitated and allowed to stand. After removing a supernatant therefrom, a precipitate therein was dissolved in 80 g of cyclohexanone, and the solution was agitated by using 320 g of methanol and allowed to stand (a first process). A supernatant was removed therefrom, and a precipitate therein was dissolved in 80 g of cyclohexanone (a second process). The first and second processes were regarded as one purification process, and this purification process was repeated three times in total. The purified polymer was dissolved in 80 g of cyclohexanone, and methanol and distilled water remaining in the solution was removed under a reduced pressure, obtaining a compound represented by the following Chemical Formula 5.

[Chemical Formula 5]

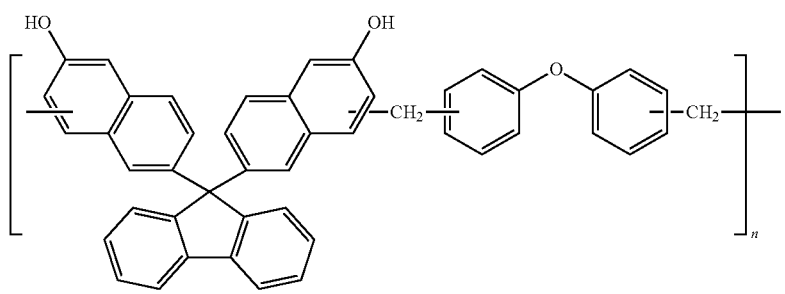

Synthesis Example 3

A three-necked flask was dipped in a 100° C. oil thermostat. The flask was maintained at the same temperature, and agitation was performed by using a stirring magnetic bar. Subsequently, 43.65 g (0.2 mol) of pyren-4-ol and 33.24 g (0.2 mol) of 1,3-bis(methoxymethyl)benzene were put in the reactor and dissolved in 52 g of propylene glycol monomethyl ether acetate (PGMEA). Then, 1.23 g (8 mmol) of diethylsulfate was added to the reactor.

The polymerization was performed while the reactor was maintained at 100° C., a sample was taken from the polymerization reactant by every one hour to measure its weight average molecular weight, and when the weight average molecular weight reached 3,500 to 4,000, the reaction was finished.

When the polymerization reaction was terminated, the reactant was slowly cooled down to room temperature and then 30 g of distilled water and 300 g of methanol were added thereto, and the mixture was strongly agitated and allowed to stand. After removing a supernatant therefrom, a precipitate therein was dissolved in 60 g of propylene glycol monomethyl ether acetate (PGMEA), and subsequently, the solution was strongly agitated by using 250 g of methanol and allowed to stand (a first process). A supernatant obtained therefrom was removed, and a precipitate therein was dissolved in 60 g of propylene glycol monomethyl ether acetate (PGMEA) (a second process). The first and second processes were regarded as one purification process, and this purification process was repeated three times in total. The purified polymer was dissolved in 60 g of propylene glycol monomethyl ether acetate (PGMEA), and methanol and distilled water remaining there were removed under a reduced pressure, obtaining a compound represented by Chemical Formula 6 (Mw: 4000).

[Chemical Formula 6]

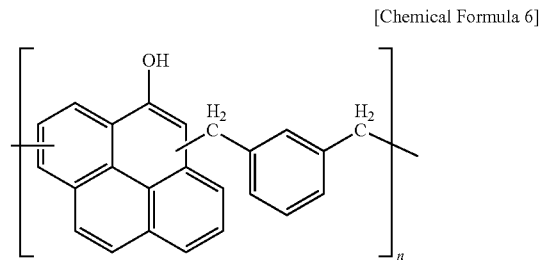

Synthesis Example 4

A compound (Mw: 4500) represented by Chemical Formula 7 was prepared through the same synthesis as Synthesis Example 3 by using 70 g (0.2 mol) of 4,4'-(9H-fluorene-9,9-diyl)diphenol, 33.24 g (0.2 mol) of 1,3-bis(methoxymethyl)benzene, 70 g of propylene glycol monomethyl ether acetate (PGMEA) and 1.23 g (8 mmol) of diethylsulfate.

[Chemical Formula 7]

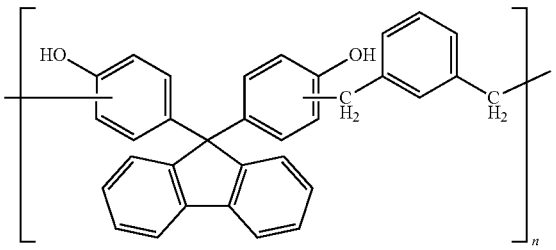

Synthesis Example 5

A compound (Mw: 4300) represented by Chemical Formula 8 was prepared through the same synthesis as Synthesis Example 3 by using 28.83 g (0.2 mol) of naphthalene-1-ol, 48.46 g (0.2 mol) of 3,5-bis(methoxymethyl)biphenyl, 53 g of propylene glycol monomethyl ether acetate (PGMEA) and 1.23 g (8 mmol) of diethylsulfate.

[Chemical Formula 8]

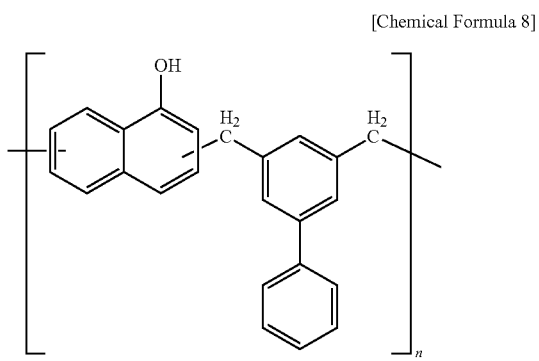

Synthesis Example 6

A compound (Mw: 4200) represented by Chemical Formula 9 was prepared through the same synthesis as Synthesis Example 3 by using 12.82 g (0.1 mol) of naphthalene, 33.24 g (0.2 mol) of 1,3-bis(methoxymethyl)benzene, 45.00 g (0.1 mol) of 6,6'-(9H-fluorene-9,9-diyl)dinaphthalen-2-ol, 61 g of propylene glycol monomethyl ether acetate (PGMEA) and 1.23 g (8 mmol) of diethylsulfate.

[Chemical Formula 9]

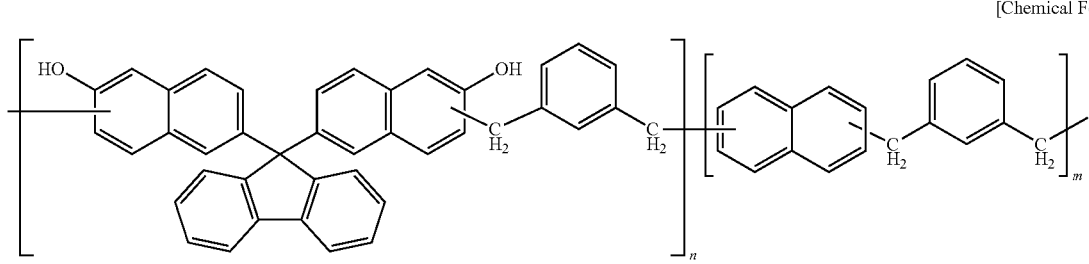

Comparative Synthesis Example 1

21.83 g of hydroxypyrene, 16.62 g of 1,4-bismethylmethoxybenzene, 1.23 g of diethylsulfate and 26.45 g of propylene glycol monomethyl ether acetate (PGMEA) were put in a flask and agitated at 100° C. for 5 to 12 hours to perform a polymerization reaction. When the polymer had a weight average molecular weight of 2,000 to 3,500, the reaction was terminated. When the polymerization reaction was terminated, the reactant was slowly cooled down to room temperature and 40 g of distilled water and 400 g of methanol were added thereto, and the mixture was strongly agitated and allowed to stand. After removing a supernatant therefrom, a precipitate therein was dissolved in 80 g of cyclohexanone, and the solution was strongly agitated by using 320 g of methanol and allowed to stand (a first process). The obtained supernatant was removed, and a precipitate therein was dissolved in 80 g of cyclohexanone (a second process). The first and second processes were regarded as a one purification process, and this purification process was performed three times in total. The purified polymer was dissolved in 80 g of cyclohexanone, and methanol and distilled water remaining in the solution were removed under a reduced pressure, obtaining a compound represented by the following Chemical Formula 10.

[Chemical Formula 10]

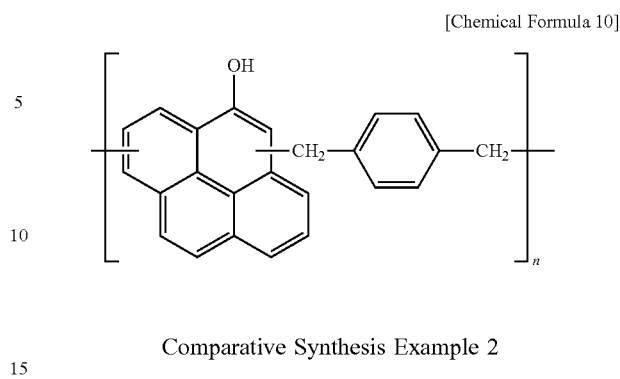

Comparative Synthesis Example 2

21.83 g of hydroxypyrene, 24.23 g of 4,4'-bismethylmethoxy-biphenyl, 1.23 g of diethylsulfate and 31.53 g of propylene glycol monomethyl ether acetate (PGMEA) were put in a flask and agitated at 100° C. for 5 to 12 hours to perform a polymerization reaction. When the polymer had a weight average molecular weight of 2,000 to 3,500, the reaction was finished. When the polymerization reaction was terminated, the reactant was slowly cooled down to room temperature and 40 g of distilled water and 400 g of methanol were added thereto, and the mixture was strongly agitated and allowed to stand. After removing a supernatant therefrom, a precipitate therein was dissolved in 80 g of cyclohexanone, and the solution was strongly agitated by using 320 g of methanol and allowed to stand (a first process). The obtained supernatant was removed, and a precipitate therein was dissolved in 80 g of cyclohexanone (a second process). The first and second processes were regarded as one purification process, and this purification process was performed three times in total. The purified polymer was dissolved in 80 g of cyclohexanone, and methanol and distilled water remaining in the solution was removed under a reduced pressure, obtaining a compound represented by the following Chemical Formula 11.

[Chemical Formula 11]

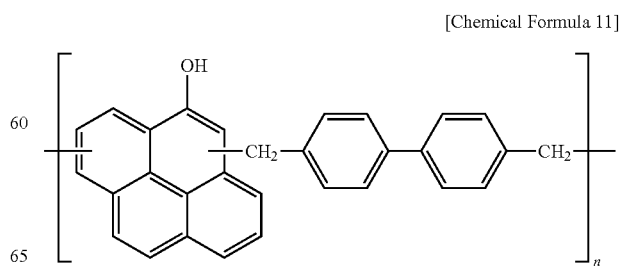

Comparative Synthesis Example 3

A compound represented by Chemical Formula 12 (Mw: 4100) was obtained through the same synthesis as Synthesis Example 3 by using 70 g (0.2 mol) of 4,4'-(9H-fluorene-9, 9-diyl)diphenol, 48.46 g (0.2 mol) of 4,4'-bismethyl-methoxy-biphenyl, 80 g of propylene glycol monomethyl ether acetate (PGMEA) and 1.23 g (8 mmol) of diethylsulfate.

[Chemical Formula 12]

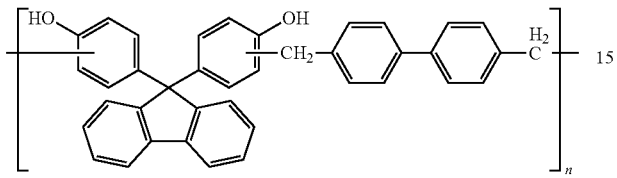

Comparative Synthesis Example 4

A compound represented by Chemical Formula 13 (Mw: 4200) was obtained through the same synthesis as Synthesis Example 3 by using 55.67 g (0.2 mol) of perylene, 33.24 g (0.2 mol) of 1,4-bis(methoxymethyl)benzene, 60 g of propylene glycol monomethyl ether acetate (PGMEA) and 1.23 g (8 mmol) of diethylsulfate.

[Chemical Formula 13]

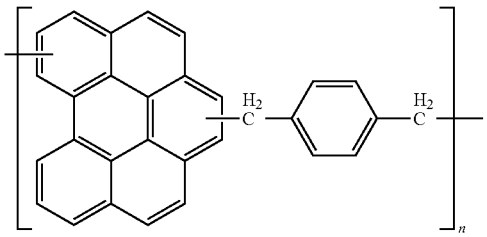

Preparation of Hardmask Composition

Example 1

A hardmask composition was prepared by dissolving the compound of Synthesis Example 1 in a mixed solvent of propylene glycolmonomethyl ether acetate (PGMEA) and cyclohexanone (7:3 (v/v)) and filtering the solution. Depending on a desired thickness, the compound was included in a range of 4 to 13 wt % based on the total weight of the hardmask composition.

Example 2

A hardmask composition was prepared according to the same method as Example 1 except for using the compound of Synthesis Example 2 instead of the compound of Synthesis Example 1.

Example 3

A hardmask composition was prepared according to the same method as Example 1 except for using the compound of Synthesis Example 3 instead of the compound of Synthesis Example 1.

Example 4

A hardmask composition was prepared according to the same method as Example 1 except for using the compound of Synthesis Example 4 instead of the compound of Synthesis Example 1.

Example 5

A hardmask composition was prepared according to the same method as Example 1 except for using the compound of Synthesis Example 5 instead of the compound of Synthesis Example 1.

Example 6

A hardmask composition was prepared according to the same method as Example 1 except for using the compound of Synthesis Example 6 instead of the compound of Synthesis Example 1.

Comparative Example 1

A hardmask composition was prepared according to the same method as Example 1 except for using the compound of Comparative Synthesis Example 1 instead of the compound of Synthesis Example 1.

Comparative Example 2

A hardmask composition was prepared according to the same method as Example 1 except for using the compound of Comparative Synthesis Example 2 instead of the compound of Synthesis Example 1.

Comparative Example 3

A hardmask composition was prepared according to the same method as Example 1 except for using the compound of Comparative Synthesis Example 3 instead of the compound of Synthesis Example 1.

Comparative Example 4

A hardmask composition was prepared according to the same method as Example 1 except for using the compound of Comparative Synthesis Example 4 instead of the compound of Synthesis Example 1.

Evaluation

Evaluation 1: Gap-fill Characteristics and Planarization Characteristics

Each hardmask composition according to Examples 1 to 6 and Comparative Examples 1 to 4 was spin-on coated on a patterned silicon wafer and baked to form a film thereon, and the cross section of the film was examined by using a V-SEM equipment. The amount of the compound in the hardmask composition was adjusted so that the composition was formed to be 1,100 Å thick on the bare wafer.

Gap-fill characteristics of the composition were evaluated by observing the pattern cross-section to see if there was a void.

The results are provided in Table 1.

TABLE 1

|  | Gap-fill characteristics |
|---|---|
| Example 1 | No Void |
| Example 2 | No Void |

TABLE 1-continued

|  | Gap-fill characteristics |
| --- | --- |
| Example 3 | No Void |
| Example 4 | No Void |
| Example 5 | No Void |
| Example 6 | No Void |
| Comparative Example 1 | No Void |
| Comparative Example 2 | No Void |
| Comparative Example 3 | Void generated |
| Comparative Example 4 | Void generated |

Referring to Table 1, each thin film respectively formed of the hardmask composition according to Examples 1 to 6 had no void and thus, showed excellent gap-fill characteristics.

The planarization characteristics were determined according to Calculation Equation 1 shown in FIG. 1, and as a coating thickness difference between a peri region where there wasn't a cell and a cell region was smaller, the planarization characteristics (step difference characteristics) were better. In other words, as the sum of $(h_1-h_2)$, $(h_1-h_3)$, $(h_1-h_4)$ and $(h_1-h_5)$ was smaller, the step difference characteristics became better in Calculation Equation 1 of FIG. 1.

The results are provided in Table 2.

TABLE 2

|  | Planarization characteristics (Sum (Peri-Cell step)) |
| --- | --- |
| Example 1 | 59.2 nm |
| Example 2 | 53.1 nm |
| Example 3 | 49.2 nm |
| Example 4 | 45.8 nm |
| Example 5 | 48.3 nm |
| Example 6 | 43.1 nm |
| Comparative Example 1 | 114.9 nm |
| Comparative Example 2 | 140.8 nm |
| Comparative Example 3 | 135.2 nm |
| Comparative Example 4 | 129.5 nm |

Referring to Table 2, the thin films respectively formed of the hardmask compositions of Examples 1 to 6 showed excellent planarization characteristics compared with the thin films respectively formed of the hardmask compositions of Comparative Examples 1 to 4.

Evaluation 2: Thickness Decrease Ratio

The hardmask compositions according to Examples 1 and 2 and Comparative Examples 1 and 2 were respectively spin-on coated on a silicon wafer and heat-treated on a hot plate at 400° C. for 2 minutes, forming each thin film. The amount of the compound in the hardmask composition was adjusted so that the composition had a thickness of 3,000 Å on a bare wafer.

Subsequently, thickness decrease ratios of the thin films were calculated according to the following Calculation Equation 2.

Thickness decrease ratio (%)=(thin film thickness after spin-on coating−thin film thickness after heat treatment at 400° C. for 2 minutes)/(thin film thickness after spin-on coating)×100(%)   [Calculation Equation 2]

The results are provided in Table 3.

TABLE 3

|  | Thickness decrease ratio |
| --- | --- |
| Example 1 | 28.6% |
| Example 2 | 21.7% |

TABLE 3-continued

|  | Thickness decrease ratio |
| --- | --- |
| Comparative Example 1 | 28.6% |
| Comparative Example 2 | 27.3% |

Referring to Table 3, the hardmask thin films according to Examples 1 and 2 maintained a thickness decrease ratio of less than or equal to 30%. Accordingly, when the hardmask compositions according to Examples 1 and 2 were respectively coated on a patterned wafer, the hardmask compositions according to Examples 1 and 2 were expected to have similar heat resistance to the ones according to Comparative Examples 1 and 2.

Evaluation 3: Etch Resistance

The hardmask compositions according to Examples 1 and 2 and Comparative Examples 1 and 2 were respectively spin-on coated to be 4,000 Å thick on a silicon wafer and heat-treated on a hot plate at 400° C. for 2 minutes, forming each thin film. Subsequently, thickness of the thin film was measured. Subsequently, the thin film was dry-etched by using a $CHF_3/CF_4$ mixed gas and a $N_2/O_2$ mixed gas respectively for 100 seconds and 60 seconds, and then thickness of the thin film was measured again. The thicknesses of the thin film before and after the dry etching and etching time were used to calculate a bulk etch rate (BER) according to the following Calculation Equation 3.

(Initial thin film thickness−Thin film thickness after etching)/Etching time (Å/s)   [Calculation Equation 3]

The results are provided in Table 4.

TABLE 4

|  | Bulk etch rate (Å/sec) | |
| --- | --- | --- |
|  | $CHF_3/CF_4$ mixed gas | $N_2/O_2$ mixed gas |
| Example 1 | 29.5 | 25.2 |
| Example 2 | 27.6 | 27.8 |
| Comparative Example 1 | 29.5 | 24.4 |
| Comparative Example 2 | 28.4 | 26.6 |

Referring to Table 4, each thin film respectively formed of the hardmask compositions according to Examples 1 and 2 showed similar bulk etch characteristics compared with the ones respectively formed of the hardmask compositions according to Comparative Examples 1 and 2.

As described above, embodiments are directed to a hardmask composition that may provide solubility in a solvent, gap-fill characteristics and planarization characteristics, and may provide heat resistance and etch resistance.

By way of summation and review, it may be difficult to provide a fine pattern having an excellent profile using a general lithographic technique. Accordingly, a layer, called a hardmask layer, may be formed between the material layer and the photoresist layer to provide a fine pattern. The hardmask layer plays a role of an intermediate layer for transferring the fine pattern of photoresist to the material layer through the selective etching process. Accordingly, the hardmask layer is desired to have characteristics such as heat resistance and etch resistance, to tolerate multiple etching processes. A hardmask layer may be formed by a spin-on coating method instead of the chemical vapor deposition. The spin-on coating method may be easy to perform, and may improve gap-fill characteristics and planarization characteristics. The gap-fill characteristics of filling a pattern with the layer without a space are important when multiple patterns are used to realize a fine pattern. In addition, the planarization characteristics of planarizing the surface of the layer with a lower layer are important when a substrate has a bump, or a wafer as the substrate has both a pattern-dense region and no-pattern region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming patterns, comprising:
providing a material layer on a substrate;
patterning a surface of the material layer to form a surface pattern such that the material layer has gaps at a surface thereof
applying a hardmask composition on the surface pattern of the material layer;
heat-treating the hardmask composition to form a hardmask layer;
forming a silicon-containing thin layer on the hardmask layer;
forming a photoresist layer on the silicon-containing thin layer;
exposing and developing the photoresist layer to form a photoresist pattern
selectively removing the silicon-containing thin layer and the hardmask layer using the photoresist pattern to expose a part of the material layer; and
etching an exposed part of the material layer, wherein:
the hardmask composition includes:
a polymer, the polymer being composed of terminal units and repeating units, the repeating units consisting essentially of moieties represented by the following Chemical Formula 1; and
a solvent,

*-A-B-*           [Chemical Formula 1]

wherein, in the Chemical Formula 1, A is one of groups listed in the following Group 2, and B is one of groups listed in the following Group 1, provided that at least one of A or B includes at least one hydroxy group,

[Group 1]

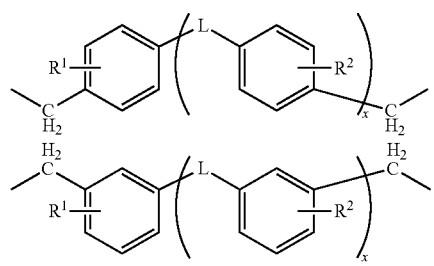

wherein, in the Group 1,
R$^1$ and R$^2$ are independently hydrogen, a hydroxy group, a methoxy group, an ethoxy group, a halogen, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, L is —O—, and x is an integer of 1≤x≤30, and

[Group 2]

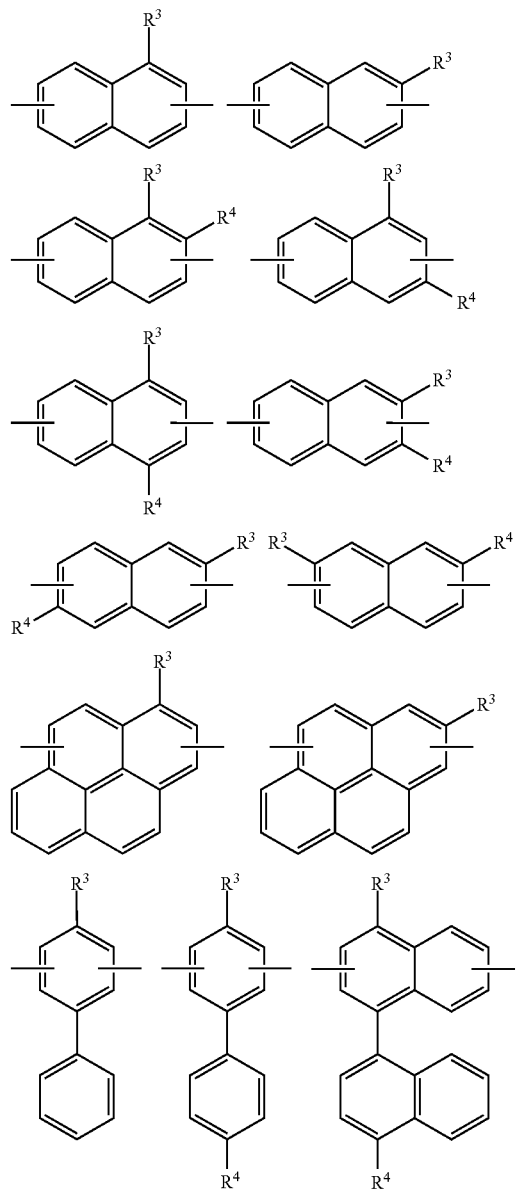

-continued

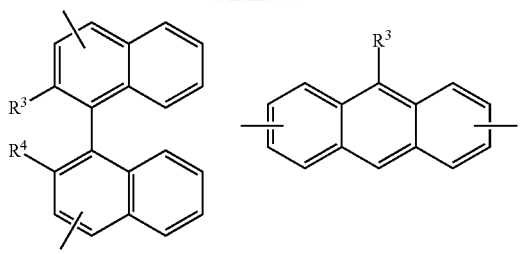

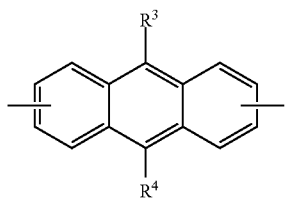

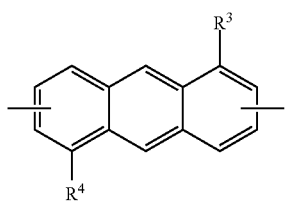

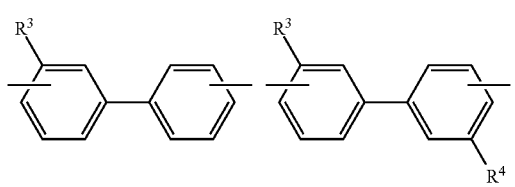

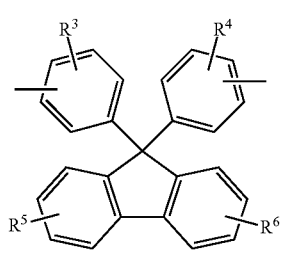

-continued

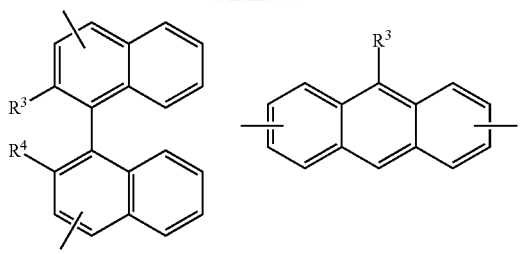

wherein, in the Group 2, $R^3$ to $R^6$ are independently hydrogen, a hydroxy group, a methoxy group, an ethoxy group, a halogen, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and in each of the groups listed in Group 2, at least one of $R^3$ to $R^6$ are a hydroxy group, a methoxy group, an ethoxy group, a halogen, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

2. The method as claimed in claim 1, wherein the hardmask composition is applied using a spin-on coating method.

3. The method as claimed in claim 1, wherein the hardmask layer is formed by heat-treating at about 100° C. to about 500° C.

4. The method as claimed in claim 1, further comprising forming a bottom antireflective coating (BARC) before forming the photoresist layer.

5. The method as claimed in claim 1, wherein the silicon-containing thin layer comprises silicon oxynitride (SiON).

* * * * *